United States Patent [19]
Nakajima et al.

[11] Patent Number: 5,751,193
[45] Date of Patent: May 12, 1998

[54] RUBIDIUM ATOMIC OSCILLATOR WITH LASER DIODE WAVELENGTH ADJUSTMENT

[75] Inventors: Yoshifumi Nakajima; Yoshito Koyama, both of Kawasaki, Japan

[73] Assignee: Fujitsu Limited, Kawasaki, Japan

[21] Appl. No.: 638,471

[22] Filed: Apr. 26, 1996

[30] Foreign Application Priority Data

Jun. 9, 1995 [JP] Japan ................................. 7-142843

[51] Int. Cl.$^6$ ......................................... H03L 7/26
[52] U.S. Cl. ............................................ 331/3; 331/94.1
[58] Field of Search ..................... 331/3, 94.1; 250/201.1, 250/205, 552, 573, 575, 229

[56] References Cited

U.S. PATENT DOCUMENTS

| | | | |
|---|---|---|---|
| 5,148,437 | 9/1992 | Ohtsu | 331/3 X |
| 5,553,087 | 9/1996 | Telle | 331/3 X |
| 5,606,291 | 2/1997 | Verbanets | 331/3 |

*Primary Examiner*—David Mis
*Attorney, Agent, or Firm*—Staas & Halsey

[57] ABSTRACT

A rubidium atomic oscillator includes a voltage-controlled oscillator (VCO) producing a first microwave signal for an output, and a light source producing pumping light of which the wavelength is externally controlled. The oscillator further includes a division part for dividing the pumping light into a first light and a second light, a wavelength shift part changing a wavelength of the second light to produce a third light, and a cavity resonator, oscillated by a second microwave signal, which absorbs the first light and the third light, the cavity resonator having a resonance cell filled with a rubidium gas. In an electrical control part, the second microwave signal is produced based on the first microwave signal from the VCO, a level of the first light passed through the cavity resonator is detected, and a frequency of the VCO is controlled so that the first light is maximally absorbed in the cavity resonator. In an optical control part, a level of the third light passed through the cavity resonator is detected and the wavelength of the light source is controlled so that the third light is maximally absorbed in the cavity resonator. In the oscillator, by properly changing a wavelength of the third light in the wavelength shift part, stability of the first microwave signal may be increased.

14 Claims, 9 Drawing Sheets

RUBIDIUM ATOMIC OSCILLATOR WITH LASER DIODE WAVELENGTH ADJUSTMENT

BACKGROUND OF THE INVENTION

1. Field of the Invention

The present invention general relates to a rubidium atomic oscillator, and more particularly, to a rubidium atomic oscillator using a laser diode (LD) excitation operation.

The rubidium atomic oscillator generates an extremely-stabilized microwave by using transition between energy levels of rubidium atoms. The rubidium atomic oscillator is widely used for a clock source in a synchronous network and a frequency reference in a broadcasting apparatus and a navigation apparatus, etc.

It is desired that the rubidium atomic oscillator may flexibly control a wavelength of pumping light using only one LD and electric characteristics of the rubidium atomic oscillator may be improved.

2. Description of the Related Art

FIG. 1 shows a configuration example of a prior-art rubidium atomic oscillator. The rubidium atomic oscillator shown in FIG. 1 uses a lamp excitation operation. The rubidium atomic oscillator includes an optical microwave unit (OMU) 1 having a rubidium lamp 100. The rubidium lamp 100 generates resonance light by being subjected to high-frequency-induction-heating with a high-frequency source 101. The resonance light passes through a resonance cell which is provided in a cavity resonator 2 and is filled with rubidium gas, and is converted to an electrical signal in a photo detector 4.

Around the cavity resonator 2, a C-magnetic-field coil 102 for generating a magnetic field in the resonance cell 3 is provided. To the C-magnetic-field coil 102, a current according a control voltage is applied by a C-magnetic-field-current control circuit 103. The OMU 1 is magnetic-shielded by a magnetic shield 104 to prevent influences from outside the magnetic field.

The rubidium atomic oscillator further includes a voltage-controlled crystal oscillator (VCO) 6. In a frequency combiner and phase modulator 7, an output frequency of the VCO 6 is multiplied, and the output of the VCO 6 is phase-modulated by a low frequency signal f1 produced from a low frequency oscillator (OSC(1)) 8 to produce a phase-modulated signal. By the phase-modulated signal, a microwave output having a high-order high-frequency wave is generated through a varactor diode 9. The microwave oscillates the cavity resonator 2 through a loop 11.

An output electrical signal produced from the photo detector 4 has a frequency f1, and is amplified in an amplifier 12. After amplification, the output electrical signal with the output signal produced from the OSC(1) 8 is provided to a coherent detector 13 to be detected. An output of the coherent detector 13 is fed back to the VCO 6 through an integrator 14. By the output of the coherent detector 13, an oscillation frequency of the VCO 6 is controlled.

FIG. 2 shows an illustration for explaining an operation principle of the prior-art rubidium atomic oscillation shown in FIG. 1. The rubidium atoms in the resonance cell 3 are initially in a thermal equilibrium state and present in a ground state. In the ground state, atoms at an energy level 5S, F=1, and atoms at an energy level 5S, F=2 are present in the same probability. However, when both groups of the atoms are optically pumped by the resonance light produced from the rubidium lamp 100, only the atoms at the energy level 5S, F=1 are excited to an energy level 5P.

Since the energy level 5P is unstable, the excited atoms at that energy level fall down to the ground level with a spontaneous emission. At this time, the excited atoms are emitted to both of the energy level 5S, F=1 and the energy level 5S, F=2, in the same transition probability. Therefore, after the excitation and the emission are repeatedly carried out, substantially only the rubidium atoms are present at the energy level 5S, F=2, and, thus, those atoms are in a negative temperature state.

When the atoms are in the negative temperature state and when the microwave generated in the VCO 6 shown in FIG. 1 is applied to the atoms, the atoms at the energy level 5S, F=2 are transited to the energy level 5S, F=1. At this time, since optical energy is absorbed, the detected amount of light in the photo detector 4 decreases. In this case, transition probability from the energy level 5S, F=2 to the energy level 5S, F=1 is maximized when the frequency of the microwave is identical to a transition frequency corresponding to an energy difference between the energy level 5S, F=2 and the energy level 5S, F=1. Further, the transition probability decreases as the frequency of the microwave is shifted from that transition frequency.

Therefore, characteristics of the output of the photo detector 4 to the microwave frequency is represented by V-shaped characteristics of which the center frequency is the transition frequency. Namely, when the microwave frequency is identical to the transition frequency, the light from the lamp is maximally absorbed in the resonance cell, and, thus, the output of the photo detector 4 is minimized.

Accordingly, as discussed above, the microwave signal is previously phase-modulated by the low frequency signal, and the signal obtained by coherent-detecting the output of the photo detector 4 with that low frequency signal is fed back to the VCO 6 to control the oscillation frequency of the VCO 6. As a result, the microwave having a frequency identical to the transition frequency may be obtained.

However, in the prior-art rubidium atomic oscillator using the lamp excitation operation, a spectrum width of the generated light is relatively wide. Therefore, a difference between the microwave frequency and the transition frequency can not sharply be derived. Accordingly, there is a problem in that the prior-art rubidium atomic oscillator using the lamp excitation operation may not have sufficient frequency stability (short-time-period stability or signal to noise) in the generated microwave.

On the other hand, recently, a laser diode (LD) generating 0.78-μm light which has the same wavelength as that of the light produced from the rubidium lamp has been developed. The spectrum width of the light generated from the LD is narrower than that of the light generated from the rubidium lamp. When the LD is used for the excitation light source of the rubidium atomic oscillator, the short-time period stability (signal to noise) of the generated microwave may be expected to be improved. Accordingly, the LD-excitation-type rubidium atomic oscillators are actively being developed.

The spectrum of the LD light is sharp, however, it is difficult to set a wavelength of the LD light to a given wavelength. Therefore, it is required to control the wavelength of the LD light to be set to the given wavelength. Accordingly, the LD-excitation-type rubidium atomic oscillator has two systems, the first system is an optical control system for controlling the wavelength of the LD light, and the second system is an electrical control system for controlling the frequency of the microwave signal.

Further, for a configuration of the LD-excitation-type rubidium atomic oscillator, in general, two methods are known. In the first method, the above-mentioned optical control system and electrical control system are individually carried out by using separated rubidium cells. Using a first rubidium cell, an oscillation wavelength of the LD is controlled, and the light of the LD is provided to a second rubidium cell to generate a stable microwave signal in the same way as the above-mentioned rubidium-lamp atomic oscillator.

In the second method, both of the optical control system and the electrical control system are carried out by using the same rubidium cell. For miniaturization and cost reduction, the second method is preferred.

In the above-mentioned two methods, the wavelength of the LD light is controlled so that the LD light is mostly absorbed in the rubidium cell. However, the wavelength thus controlled does not necessarily provide a highest short-time period stability of the microwave signal obtained from the electrical control system. Therefore, in the prior-art LD-excitation-type LD oscillator, there is a problem in that whether the wavelength of the LD light is controlled to an optimum wavelength may not be confirmed, and an optimum stability of the microwave signal may not be obtained.

SUMMARY OF THE INVENTION

It is an object of the present invention to provide a rubidium atomic oscillator using an excitation operation by a laser diode (LD). In the oscillator, by using a single LD, a wavelength of a pumping LD light and a frequency of a microwave signal may individually be controlled. Therefore, a stability of the microwave signal for a frequency reference may efficiently be derived and improved. Further, light having a stabilized wavelength is also derived for an optical frequency reference. This permits the disadvantages described above to be eliminated.

The object described above is achieved by a rubidium atomic oscillator comprising: a voltage-controlled oscillator (VCO) producing a first microwave signal for an output; a light source producing pumping light having a wavelength which is externally controlled; a division part for dividing the pumping light into a first light and a second light; a wavelength shift part for changing a wavelength of the second light to produce a third light; a cavity resonator, oscillated by a second microwave signal, which absorbs the first light and the third light, the cavity resonator having a resonance cell filled with a rubidium gas; an electrical control part which produces the second microwave signal based on the first microwave signal from the VCO, the electrical control part detects a level of the first light passed through the cavity resonator, and controls a frequency of the VCO so that the first light is maximally absorbed in the cavity resonator; an optical control part which detects a level of the third light passed through the cavity resonator and controls the wavelength of the light source so that the third light is maximally absorbed in the cavity resonator; wherein by changing a wavelength of the third light in the wavelength shift part, stability of the first microwave signal is increased.

The object described above is also achieved by the rubidium atomic oscillator mentioned above, wherein: the light source comprises a laser diode; the electrical control part comprises: a modulator modulating the first microwave signal with a first frequency to produce the second microwave frequency; a first photo detector converting the first light passed through the cavity resonator to a first electrical signal; and a first coherent detector which detects the first electrical signal with the first frequency to produce a first detected signal and controls a frequency of the VCO by the first detected signal; the wavelength shift part comprises a modulator modulating the second light with a second frequency; and the optical control part comprises: a second photo detector converting the third light passed through the cavity resonator to a second electrical signal; and a second coherent detector which detects the second electrical signal with a third frequency to produce a second detected signal and controls the wavelength of the pumping light of the laser diode by the second detected signal and the third frequency.

According to the above-mentioned rubidium atomic oscillator, in an electrical control system, the first microwave signal is produced from the voltage-controlled oscillator, and is modulated by the first frequency f1 to produce the second microwave signal. The second microwave signal oscillates the cavity resonator having the resonance cell. The first light separated from the pumping light of the laser diode (for example, a 0.78-μm laser diode is applicable) is passed through the resonance cell and is transmitted to the first photo detector to be converted to the first electrical signal. The first electrical signal is coherent-detected with the first frequency f1, and the detected signal controls the oscillation frequency of the voltage-controlled oscillator. In this way, the frequency of the first microwave signal is controlled so that the first light is maximally absorbed in the resonance cell.

In an optical control system, the second light separated from the pumping light of the laser diode is transmitted to the wavelength shift part, and the wavelength of the second light is changed according to the second frequency f2 to produce the third light. The third light is passed through the resonance cell, and is transmitted to the second photo detector to be converted to the second electrical signal. The second electrical signal is coherent-detected with the third frequency f3, and the detected signal with the third frequency f3 controls the wavelength of the laser diode. In this way, the wavelength of the laser diode is controlled so that optical absorption of the third light in the rubidium gas may be maximized.

Further, the wavelength of the third light in the wavelength shift part is properly changed by adjusting the second frequency so as to increase stability of the first microwave signal. Therefore, short-time period stability of the output microwave signal may be improved as compared to the prior-art oscillator in which the wavelength of the laser diode is controlled to be only the wavelength in relation to a transition frequency of the rubidium gas. In the transition frequency, the light of the light source is maximally absorbed in the rubidium gas.

The object described above is also achieved by the rubidium atomic oscillator mentioned above, wherein the oscillator further comprises: a second-harmonic wave detector detecting a second harmonic wave of the first frequency from the first electrical signal produced in the first photo detector; and a peak-value detector which detects a peak value of the second harmonic wave and controls the second frequency of the wavelength shift part according to the peak value; wherein the wavelength of the third light in the wavelength shift part is automatically adjusted so as to increase stability of the first microwave signal.

According to the above-mentioned rubidium atomic oscillator, the second harmonic signal of the first frequency f1 in the first electrical signal produced from the first photo detector is detected, and the peak value of the detected signal is obtained. According to the peak value, the second frequency is automatically changed. Further, the wavelength of the laser diode is controlled so that the third light from the wavelength shift part may be maximally absorbed in the rubidium gas. Therefore, the second frequency in the wavelength shift part is automatically changed so as to increase stability of the first microwave signal.

The object described above is also achieved by the rubidium atomic oscillator mentioned above, wherein the resonance cell comprises a first resonance cell which passes the first light produced from the division part and a second resonance cell which passes the third light produced from the wavelength shift part.

According to the above-mentioned oscillator, the first resonance cell is provided for passing the first light from the division part, and the second resonance cell is provided for passing the third light of which the wavelength is changed according to the second frequency f2 in the wavelength shift part. Therefore, a signal in the electrical control system and a signal in the optical control signal are prevented from interfering to each other. Accordingly, stability of the frequency reference signal may be further improved.

The object described above is also achieved by a rubidium atomic oscillator comprising: a voltage-controlled oscillator (VCO) producing a first microwave signal for an output; a light source producing pumping light having a wavelength which is externally controlled; a cavity resonator, oscillated by a second microwave signal, which absorbs the pumping light, the cavity resonator having a resonance cell filled with a rubidium gas; an electrical control part which produces the second microwave signal by modulating the first microwave signal from the VCO with a first frequency, the electrical control part detects a level of the pumping light passed through the cavity resonator, and controls a frequency of the VCO so that the pumping light is maximally absorbed in the cavity resonator; and an optical control part comprising: a peak-value detector which detects a peak value of a second harmonic wave of the first frequency from the pumping light passed through the cavity resonator; a signal generation part for generating second and third frequency signals having the same frequency and different phases which are shifted from each other based on the peak value; and a second coherent detector which detects the pumping light passed through the cavity resonator with the second frequency signal to produce a detected signal and controls the wavelength of the light source by the detected signal and the third frequency signal; wherein the wavelength of the pumping light of the light source is automatically adjusted so as to increase stability of the first microwave signal.

The object described above is also achieved by the rubidium atomic oscillator mentioned above, wherein the signal generation part comprises a phase locked loop circuit having: a reference oscillator which produces the third frequency signal; and a second voltage controlled oscillator which produces the second frequency signal operating in synchronization with the reference oscillator, the oscillator further including a control input provided with the peak value produced from the peak-value detector.

According to the above-mentioned rubidium atomic oscillator, in the electrical control system, the first microwave signal of the voltage controlled oscillator is modulated by the first frequency f1 to produce the second microwave signal. The second microwave signal oscillates the cavity resonator having the resonance cell. The pumping light of the laser source is passed through the resonance cell and is transmitted to the electrical control part. The frequency of the voltage-controlled oscillator is controlled based on the pumping light passed through the resonance cell so that the pumping light is maximally absorbed in the resonance cell.

In the optical control system, the signal generation part generates the second and third frequency signals having the different phases which are shifted from each other based on the peak value. Further, the wavelength of the light source is controlled with the detected output of the second coherent detector and the third frequency signal, and the pumping light passed through the cavity resonator is coherent-detected with the second frequency signal in the second coherent detector. Whereby the wavelength of the light source may be shifted from the wavelength at which the pumping light is maximally absorbed in the resonance cell. Accordingly, the wavelength of the pumping light of the light source is automatically adjusted so as to increase stability of the first microwave signal.

The object described above is also achieved by the rubidium atomic oscillator mentioned above, wherein the laser source comprises: a laser diode generating light having a wavelength which is twice that of the pumping light of the laser source, and the wavelength of the laser diode is externally controlled; and a second harmonic generator which generates a second harmonic signal from the light of the laser diode and produces the second harmonic signal as the pumping light of the laser source; wherein the light of the laser diode is also produced for an optical frequency reference signal.

According to the above-mentioned rubidium atomic oscillator, instead of the laser source (for example, a 0.78-μm laser diode), the laser diode (for example, a 1.56-μm laser diode) having a wavelength twice that of the laser source and the second harmonic generator generating the second harmonic signal of the pumping light of the laser diode is provided. In this case, from the second harmonic generator, the 0.78-μm light may be derived for the operations of the electrical and optical control systems. Further, the 1.56-μm light of the laser diode may be used for the optical frequency reference signal.

Other objects and further features of the present invention will be apparent from the following detailed description when read in conjunction with the accompanying drawings.

DETAILED DESCRIPTION OF THE PREFERRED EMBODIMENTS

Figure 1:
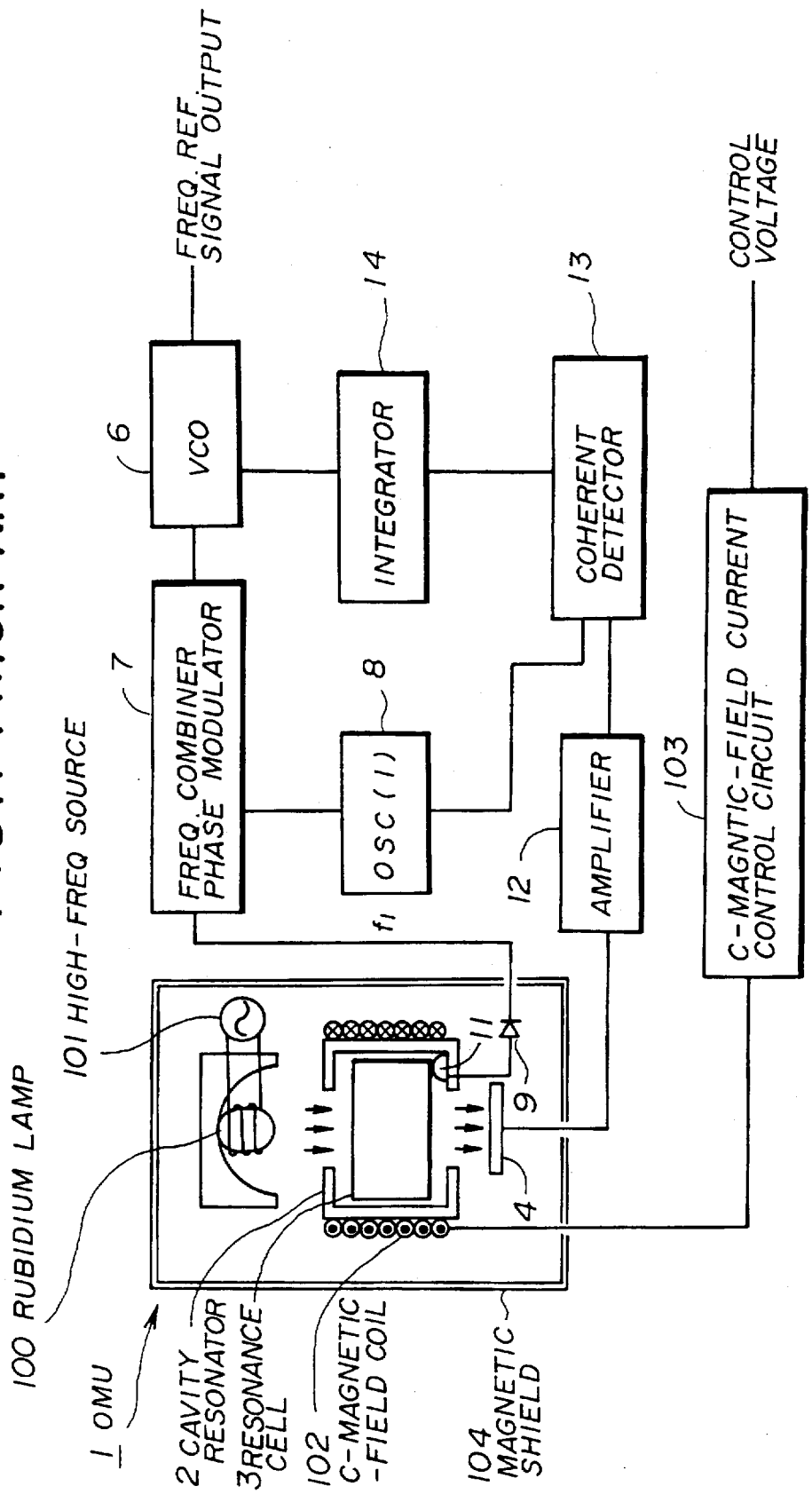
FIG. 1 shows a configuration example of a prior-art rubidium atomic oscillator.
Figure 2:
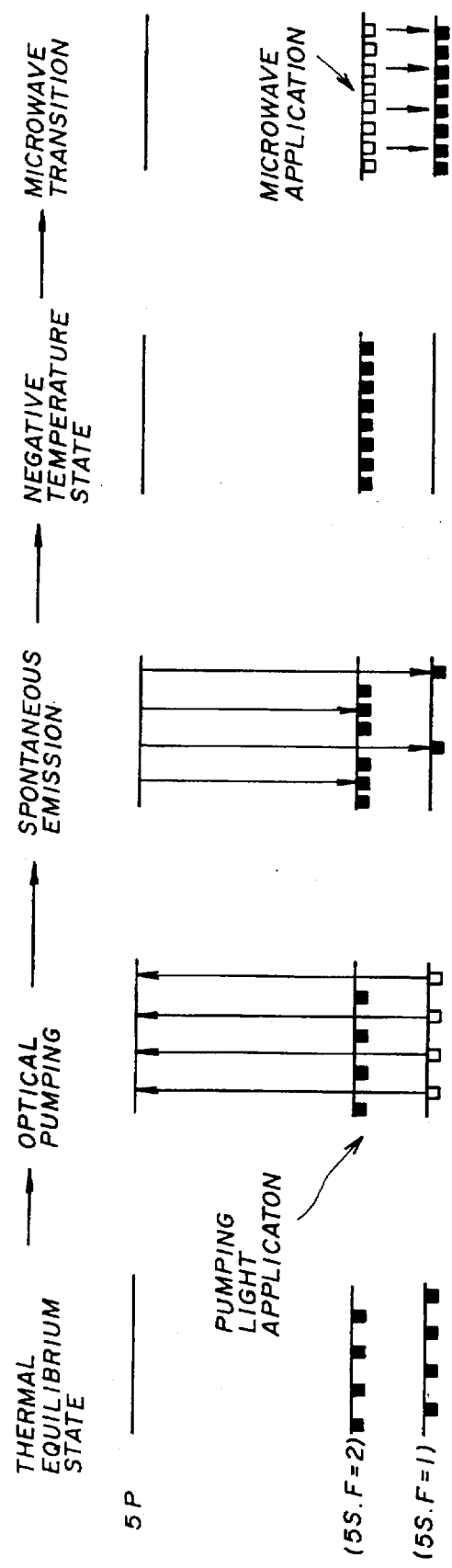
FIG. 2 shows an illustration for explaining an operation principle of the prior-art rubidium atomic oscillation shown in FIG. 1.
Figure 3:
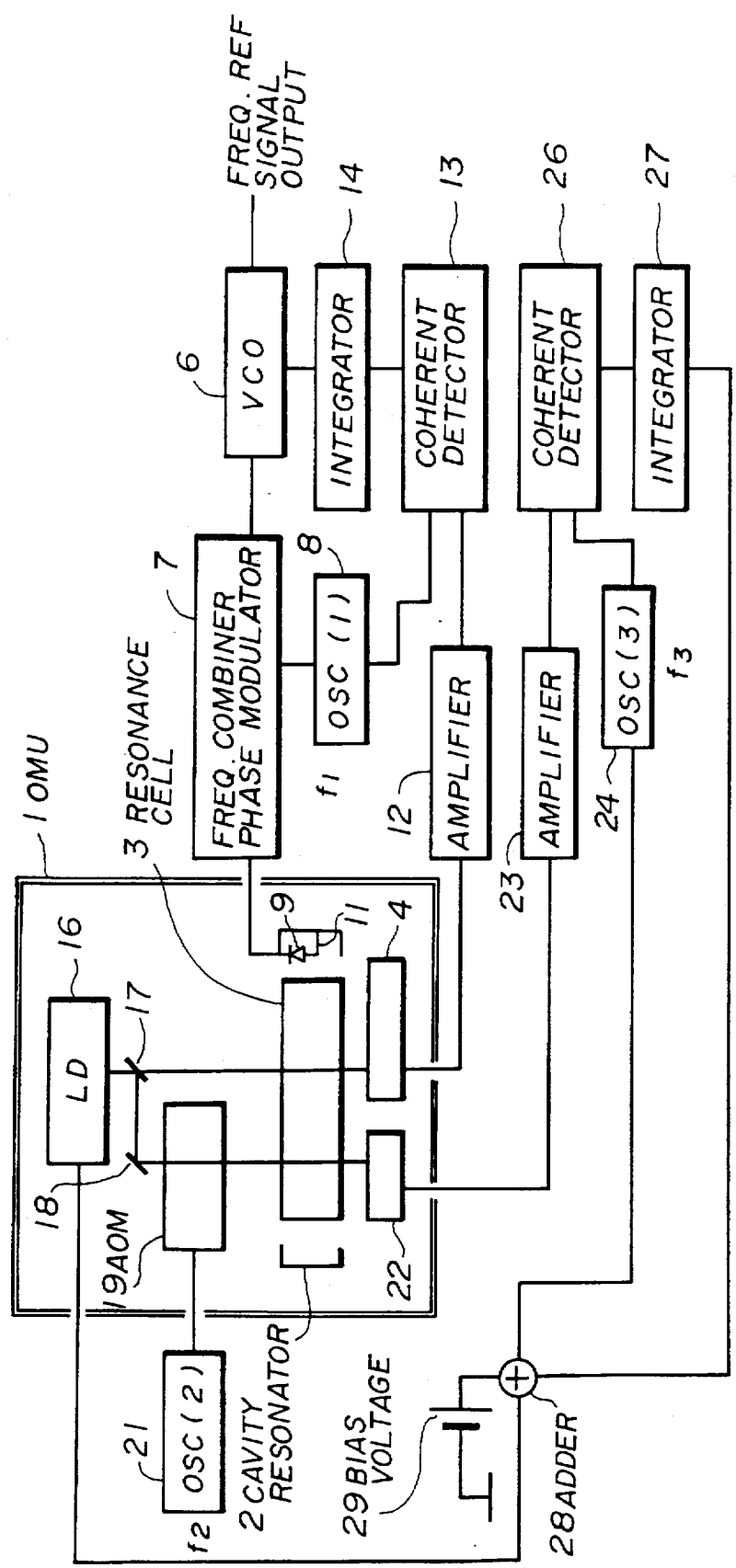
FIG. 3 shows a block diagram of a first embodiment of a rubidium atomic oscillator according to the present invention.

First, a description will be given of a first embodiment of a rubidium atomic oscillator according to the present invention, by referring to FIG. 3. FIG. 3 shows a block diagram of the first embodiment of the rubidium atomic oscillator according to the present invention. Elements in FIG. 3 which are the same as those of FIG. 1 are given the same reference numerals. The optical microwave unit (OMU) 1 includes a laser diode (LD) 16 generating 0.78-μm light. The OMU 1 further includes a semitransparent mirror 17 and a reflecting mirror 18 which divide the light generated from the LD 16 into two lights.

In the rubidium atomic oscillator shown in FIG. 3, in the frequency combiner and phase modulator 7, the output frequency of the VCO 6 is multiplied, and the output of the VCO 6 is phase-modulated by the low frequency signal f1 produced from the low frequency oscillator (OSC(1)) 8 to produce the phase-modulated signal. By the phase-modulated signal, the microwave output having the high-order high-frequency wave is generated through the varactor diode 9. The microwave oscillates the cavity resonator 2 through the loop 11.

One of the divided two lights generated from the LD 16, which passes through the semitransparent mirror 17, passes through the resonance cell 3, and is converted to an electrical signal in the photo detector 4. The electrical signal is amplified in the amplifier 12. After amplification, the electrical signal with the low frequency signal f1 produced from the OSC(1) 8 is provided to the coherent detector 13 to be detected. An output of the coherent detector 13 is integrated in the integrator 14 and is fed back to the VCO 6. By an integrated output from the integrator 14, an oscillation frequency of the VCO 6 is controlled. The above-discussed operation forms an electrical control system, which is substantially the same as that of the prior-art rubidium atomic oscillator shown in FIG. 1.

On the other hand, the other of the divided two lights generated from the LD 16, which reflects from the semitransparent mirror 17, reflects on the reflecting mirror 18, and is provided to an acoustic optical modulator (AOM) 19. AOM 19 amplitude-modulates the light generated from the LD 16 by a low frequency signal f2 produced from a low frequency oscillator (OSC(2)) 21 to derive one of side bands, and changes a wavelength of the light according to the modulation frequency f2. Output light produced from the AOM 19 passes through the resonance cell 3, and is converted to an electrical signal in a photo detector 22.

The electrical signal produced from the photo detector 22 is amplified in an amplifier 23. After amplification, the electrical signal with a low frequency signal f3 produced from a low frequency oscillator OSC(3) 24 is provided to a coherent detector 26 to be detected. An output of the coherent detector 26 is integrated in an integrator 27. The integrated output from the integrator 27 and the low frequency signal produced from the OSC(3) 24 are added to each other with a bias voltage 29 in an adder 28, and are applied to the LD 16 as its driving voltage. According to the driving voltage, the LD 16 generates light which is phase-modulated by the low frequency signal f3. The above-discussed operation forms an optical control system.

When the light generated from the LD 16 has a wavelength $\lambda_1$, the frequency of the light is represented by $c/\lambda_1$ (c is the speed of light). When the AOM 19 operates with the modulation frequency f2, the light produced from the AOM 19 has a frequency $c/\lambda_1+f2$. Whereby the wavelength of the light produced from the AOM 19 is represented by $\lambda_1+\delta\lambda$. In the optical control system, the wavelength $\lambda_1$ of the LD 16 is adjusted so that the light produced from the AOM 19 may maximally be absorbed in the resonance cell 3. At this time, the wavelength $\lambda_1+\delta\lambda$ of the light produced from the AOM 19 is referred to as $\lambda_O$.

On the other hand, in the electrical control system, the rubidium atoms in the resonance cell 3 are optically pumped by the LD light of the wavelength $\lambda_1$ (=$\lambda_O-\delta\lambda$), and the microwave frequency is controlled to be the transition frequency so that light absorption by the microwave application may be maximized.

In this way, LD control and microwave control are simultaneously carried out by using optic-and-microwave double resonance.

When the modulation frequency f2 in the AOM 19 is changed, the wavelength $\lambda_1$ of the LD light for optical pumping also changes. Therefore, the modulation frequency f2 in the AOM 19 is manually adjusted so that signal to noise ratio (short-time period stability) of the output microwave signal from the VCO 6 may be maximized. As a result, the characteristics of the rubidium atomic oscillator may further be improved. In the first embodiment, after the modulation frequency f2 is adjusted to such frequency, the frequency is fixed.

The above-discussed control is necessary under a condition in that the wavelength of the LD light giving maximum absorption in the resonance cell 3 is not necessarily identical to the wavelength of the LD light giving maximum stability of the output microwave signal. Such condition may occur when a buffer gas is combined with the rubidium gas in the resonance cell to reduce influences on the transition frequency from temperature variation and pressure variation.

Figure 4:
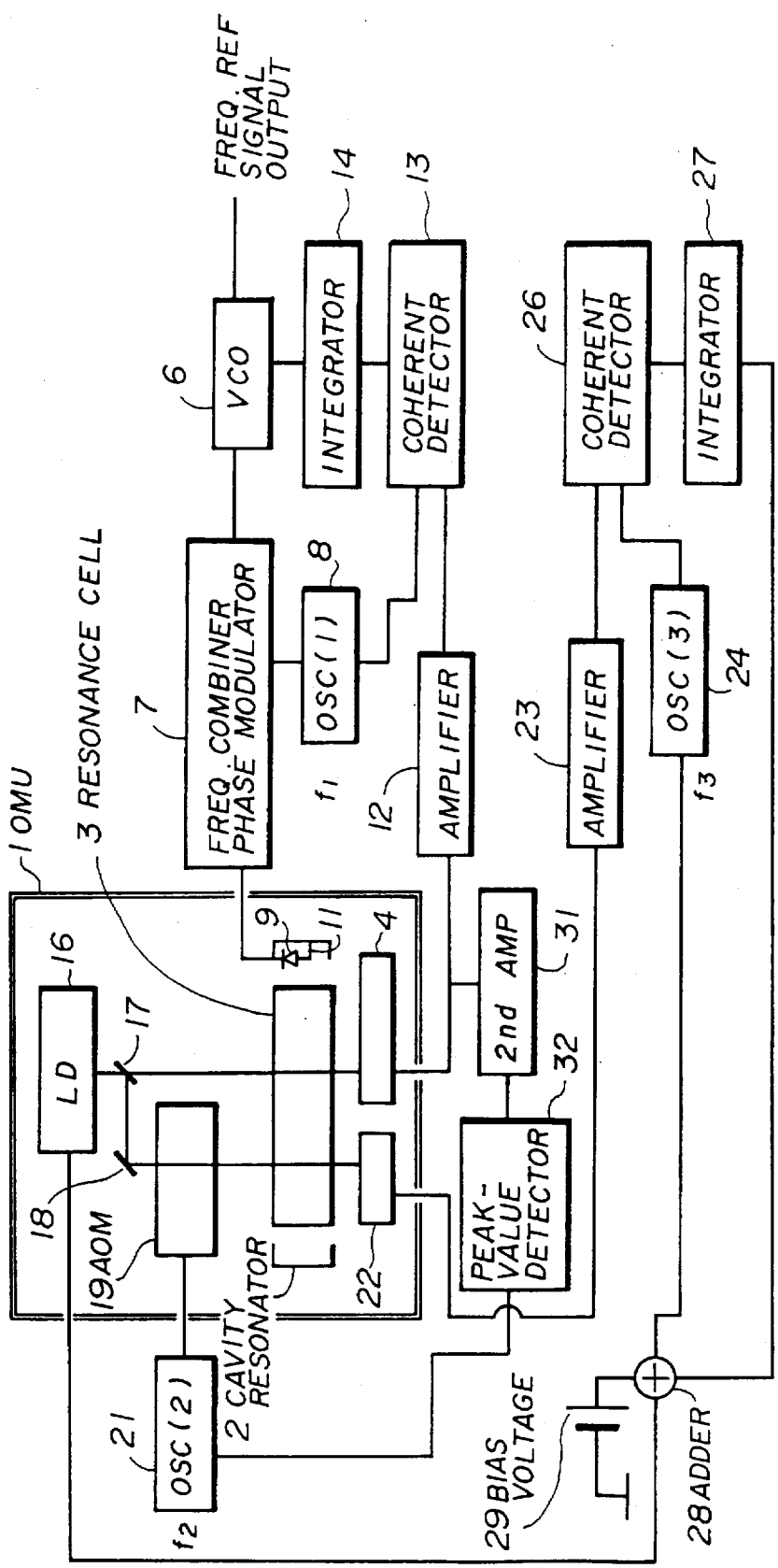
FIG. 4 shows a block diagram of a second embodiment of the rubidium atomic oscillator according to the present invention.

Next, a description will be given of a second embodiment of the rubidium atomic oscillator according to the present invention, by referring to FIG. 4. FIG. 4 shows a block diagram of the second embodiment of the rubidium atomic oscillator according to the present invention. Elements in FIG. 4 which are the same as those of FIG. 3 are given the same reference numerals. FIG. 4 shows a case where the modulation frequency f2 in the AOM 19 is properly controlled. The rubidium atomic oscillator shown in FIG. 4 includes a second amplifier (2nd AMP) 31 amplifying a second harmonic wave and a peak-value detector 32 detecting a peak value of an input signal.

In the electronic control system, when the microwave frequency is controlled to the transition frequency by the absorption light generated based on the stimulated emission, only the second harmonic wave of the low frequency signal f1 produced from the OSC(1) 8 may be detected in the photo detector 4. The 2nd AMP 31 amplifies and produces the second harmonic wave. The peak-value detector 32 detects the peak value of the second harmonic wave. According to the peak value, the oscillation frequency f2 of the OSC (2) 21 is controlled, and, thus, a level of the second harmonic wave is maximized. The level of the second harmonic wave may indicate the short-time period stability of the microwave signal.

According to the second embodiment, the optical pumping wavelength for the resonance cell 3 is automatically controlled so that the short-time period stability of the microwave signal may be maximized (namely, the optic-and-microwave double resonance may be maximized). Therefore, the characteristics of the rubidium atomic oscillator may further be improved.

Figure 5:
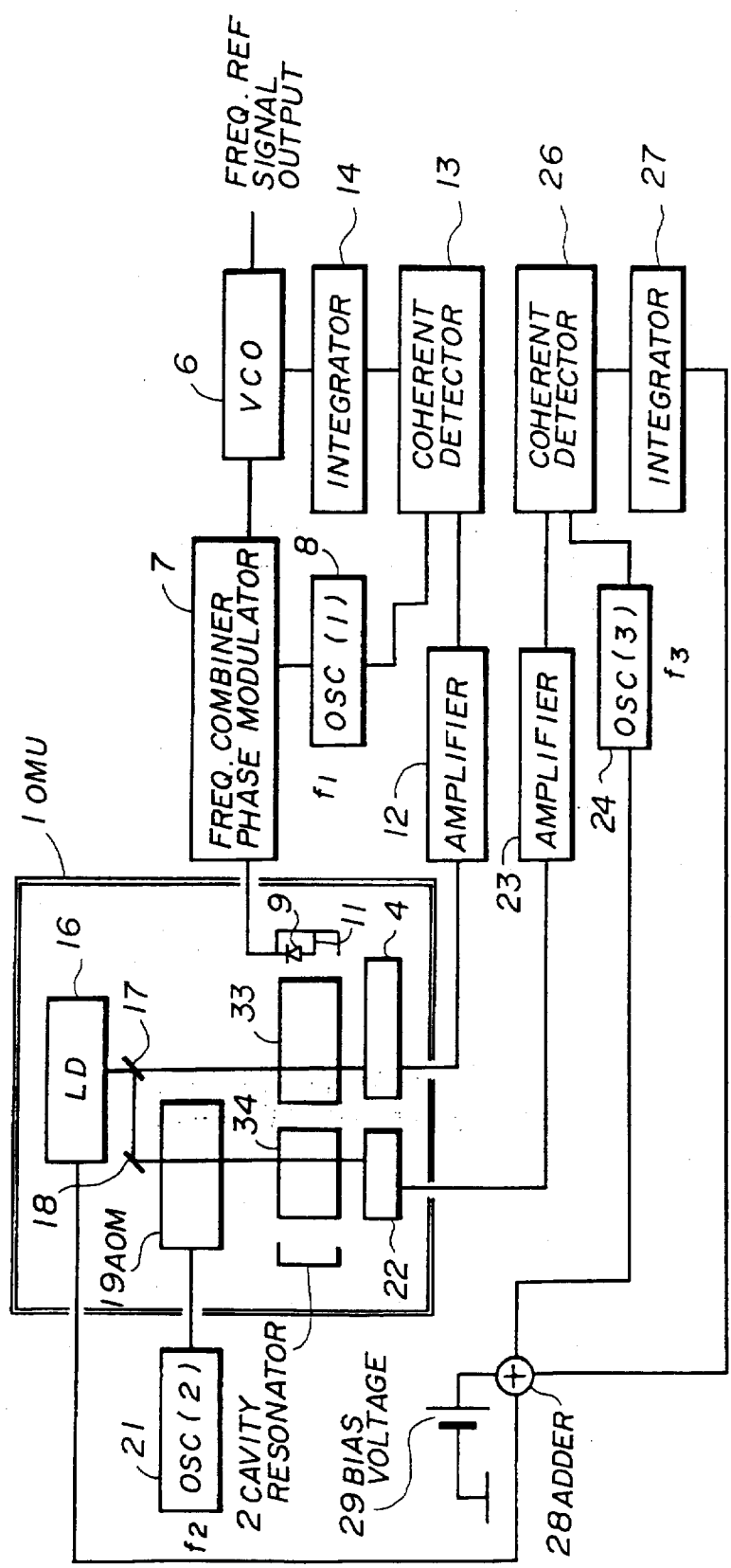
FIG. 5 shows a block diagram of a third embodiment of the rubidium atomic oscillator according to the present invention.

Next, a description will be given of a third embodiment of the rubidium atomic oscillator according to the present invention, by referring to FIG. 5. FIG. 5 shows a block diagram of the third embodiment of the rubidium atomic oscillator according to the present invention. Elements in FIG. 5 which are the same as those of FIG. 3 are given the same reference numerals. FIG. 5 shows a case where in the first embodiment, individual resonance cells are provided for the electrical control system and the optical control system. The rubidium atomic oscillator shown in FIG. 5 includes resonance cells 33, 34, each of which is filled with the rubidium gas.

In the electrical control system of the third embodiment, controlling of the microwave frequency based on the control of the VCO 6 is carried out based on the stimulated emission of the rubidium atoms in the resonance cell 33. In the optical control system thereof, controlling of the wavelength of the light generated from the LD 16 is carried out based on absorption performance of the rubidium atoms in the resonance cell 34.

According to the third embodiment, an output of the electrical control system and an output of the optical control system may individually be derived through the separated resonance cells. Therefore, a signal in the electrical control system and a signal in the optical control system will not interfere with each other. As a result, stability of the rubidium atomic oscillator may be improved.

Figure 6:
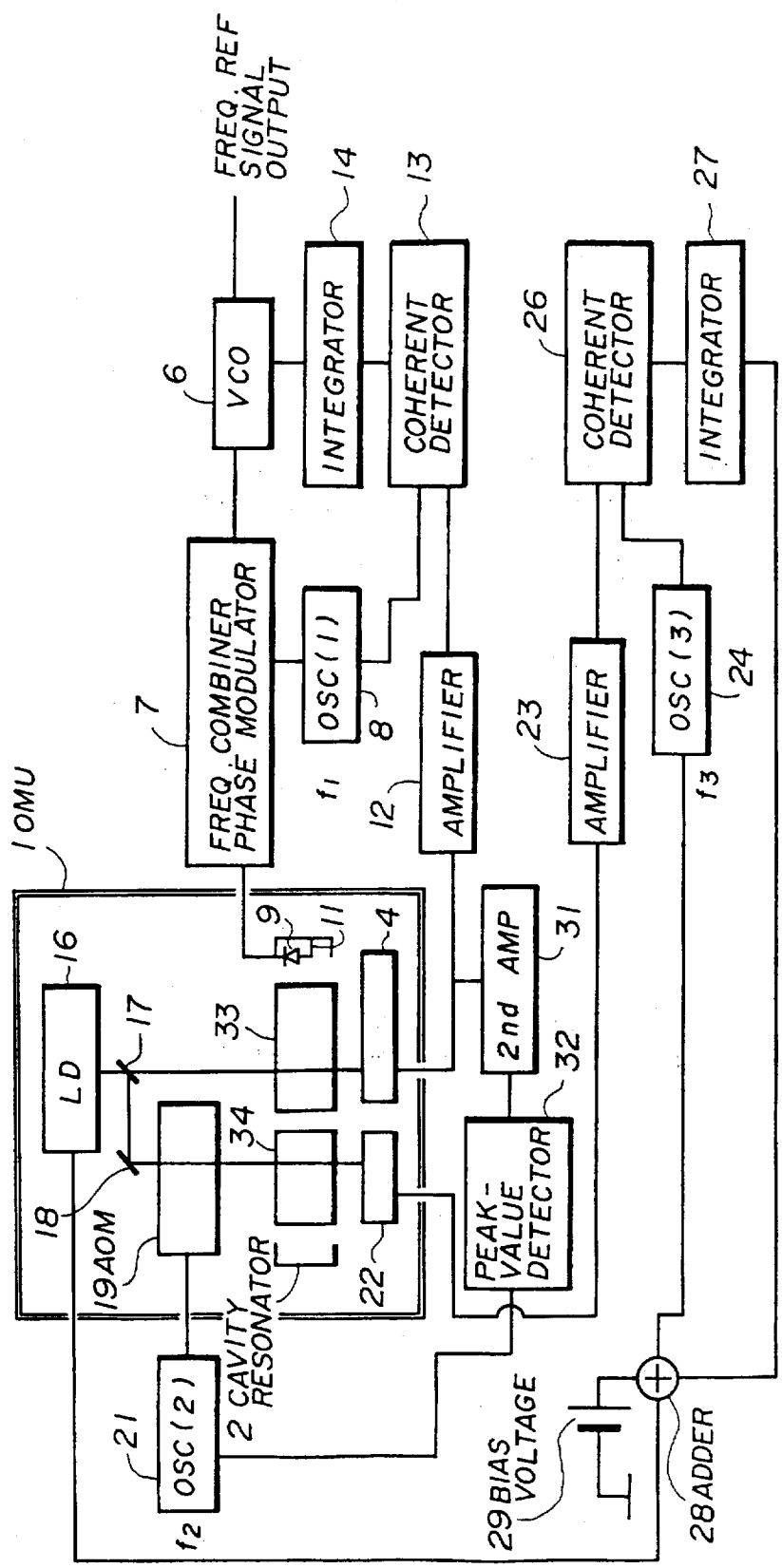
FIG. 6 shows a block diagram of a fourth embodiment of the rubidium atomic oscillator according to the present invention.

Next, a description will be given of a fourth embodiment of the rubidium atomic oscillator according to the present invention, by referring to FIG. 6. FIG. 6 shows a block diagram of the fourth embodiment of the rubidium atomic oscillator according to the present invention. Elements in FIG. 6 which are the same as those of FIG. 4 are given the same reference numerals. FIG. 6 shows a case where in the second embodiment, individual resonance cells are provided for the electrical control system and the optical control system. The rubidium atomic oscillator shown in FIG. 6 includes the resonance cells 33, 34, each of which is filled with the rubidium gas.

In the electrical control system of the fourth embodiment, control of the microwave frequency based on the control of the VCO 6 is carried out based on the stimulated emission of the rubidium atoms in the resonance cell 33. In the optical control system thereof, control of the wavelength of the light generated from the LD 16 is carried out based on absorption performance of the rubidium atoms in the resonance cell 34.

According to the fourth embodiment, an output of the electrical control system and an output of the optical control system may individually be derived through the separated resonance cells. Therefore, a signal in the electrical control system and a signal in the optical control system will not interfere with each other. As a result, stability of the rubidium atomic oscillator may be improved.

Figure 7:
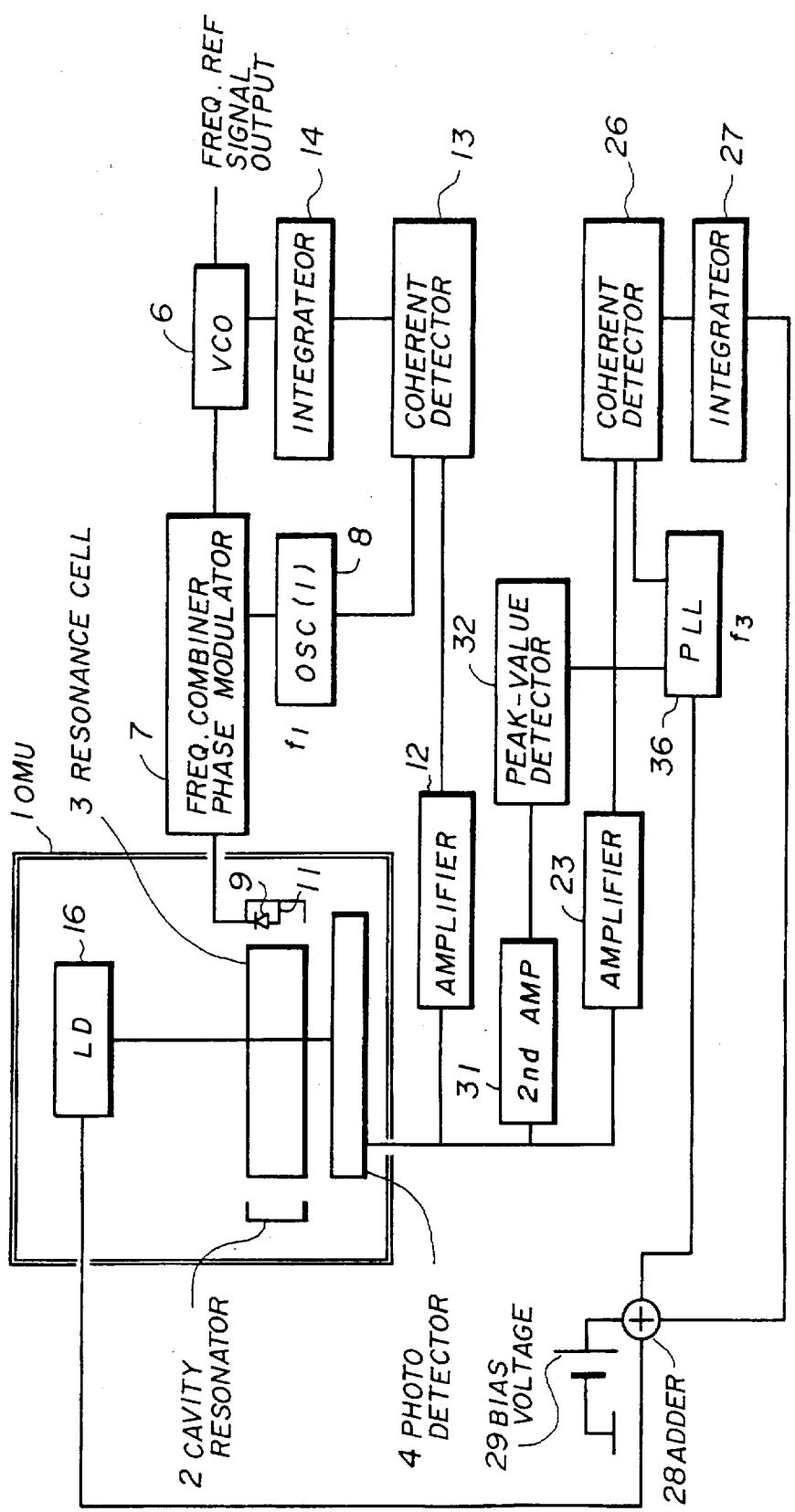
FIG. 7 shows a block diagram of a fifth embodiment of the rubidium atomic oscillator according to the present invention.

Next, a description will be given of a fifth embodiment of the rubidium atomic oscillator according to the present invention, by referring to FIG. 7 and FIG. 8. FIG. 7 shows a block diagram of the fifth embodiment of the rubidium atomic oscillator according to the present invention. Elements in FIG. 7 which are the same as those of FIG. 3 and FIG. 4 are given the same reference numerals. FIG. 7 shows a case where a function of the AOM in the optical control system is replaced with a phase locked loop (PLL), and the wavelength of the light source (LD) is controlled by varying an output phase of the PLL. The rubidium atomic oscillator shown in FIG. 7 includes a PLL 36.

Figure 8:
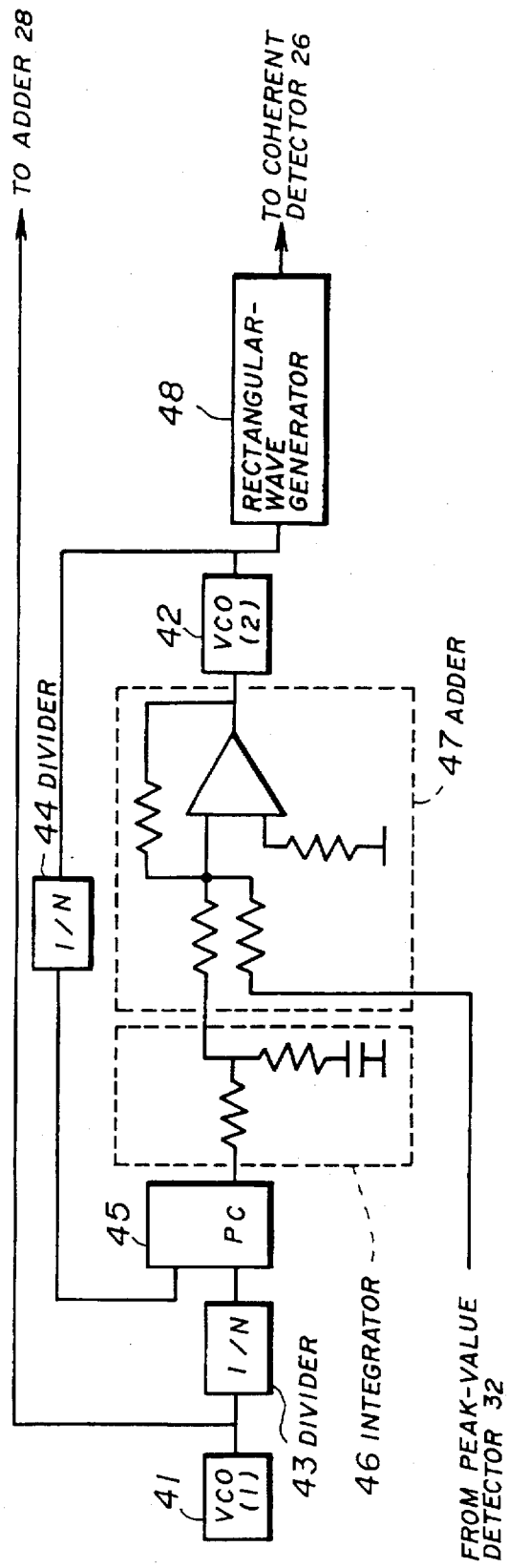
FIG. 8 shows a configuration example of a PLL shown in FIG. 7.

FIG. 8 shows a configuration example of the PLL 36 shown in FIG. 7. The PLL shown in FIG. 8 includes voltage controlled oscillators (VCO(1), VCO(2)) 41, 42, 1/N dividers 43, 44, a phase comparator (PC) 45, an integrator 46, an adder 47, and a rectangular-wave generator 48.

In the PLL 36, the VCO(1) 41 supplies the low frequency signal f3 for the phase modulation of the LD 16. The VCO(2) 42 is synchronized with the VCO(1) 41, and supplies the low frequency signal f3 for the coherent detection of the coherent detector 26 through the rectangular-wave generator 48.

In further detail, a signal obtained by dividing an output signal of the VCO(1) 41 by N in the divider 43 and a signal obtained by dividing an output signal of the VCO(2) 42 by N in the divider 44 are compared with each other in the PC 45. The comparison result from the PC 45 is integrated in the integrator 46, and the integration result is applied to a control voltage of the VCO(2) 42 through the adder 47. Whereby, the VCO(2) 42 generates the output signal in synchronization with the VCO(1) 41.

In this case, the second harmonic wave of the low frequency signal f1 produced from the photo detector 4 is amplified in the 2nd AMP 31, and in the adder 47, a signal obtained by detecting the peak value of the amplified second harmonic wave in the peak-value detector 32 is added to the output of the integrator 46. Whereby, a phase comparison output voltage of a closed loop of the PLL varies, and the output phase of the VCO(2) 42 is shifted as compared to the output phase of the VCO(1) 41. As a result, two input phases of the coherent detector 26 may be shifted from each other.

In general, in the coherent detector, when the phases of the two inputs A sin (ωt), B sin (ωt) are identical to each other, an output of the coherent detector is given by $$A \sin(\omega t) \times B \sin(\omega t) = AB/2 \times (1 - \cos(2\omega t)).$$

The output ($-\cos(2\omega t)$) is removed by the integrator, and the output $AB/2$ is integrated in the integrator. When one of the inputs changes to B sin (ωt+θ), the output of the coherent detector is given by $$A \sin(\omega t) \times B \sin(\omega t + \theta) = AB/2 \times (\cos(2\omega t + \theta) - \cos \theta)).$$

The output $-AB/2 \times (\cos \theta)$ is integrated in the integrator, and, thus, the integration output changes as compared to the case where the input phases to the coherent detector 26 are identical to each other.

In the rubidium atomic oscillator shown in FIG. 7, according to the peak-detection signal which is produced from the peak-value detector 32 based on the output of the electrical control system, the input phases of the coherent detector 26 are shifted from each other. Because of this shift, the driving voltage of the LD 16 changes and the oscillation wavelength of the LD 16 also changes. Therefore, so that the optic-and-microwave double resonance signal may be maximized, the optical pumping wavelength in the resonance cell 3 is controlled.

Figure 9:
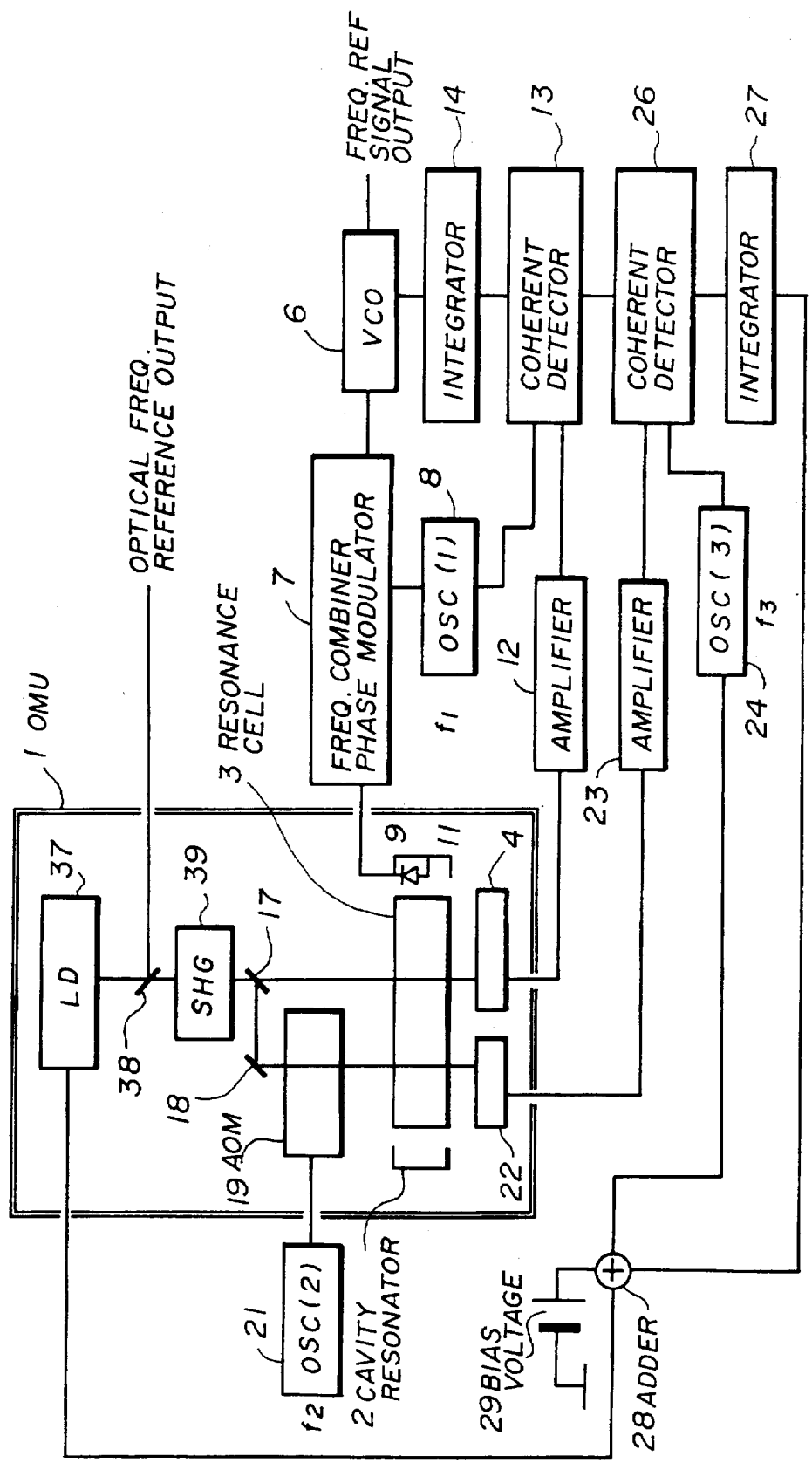
FIG. 9 shows a block diagram of a sixth embodiment of the rubidium atomic oscillator according to the present invention.

Next, a description will be given of a sixth embodiment of the rubidium atomic oscillator according to the present invention, by referring to FIG. 9. FIG. 9 shows a block diagram of the sixth embodiment of the rubidium atomic oscillator according to the present invention. Elements in FIG. 9 which are the same as those of FIG. 3 are given the same reference numerals.

In general, for an optical transmission system, a 1.56-μm optical fiber is widely used. It is found by us that the wavelength 1.56-μm substantially corresponds to twice the wavelength 0.78-μm which is used for the optical pumping of the rubidium atomic oscillator. FIG. 9 shows a case where a 1.56-μm LD light is used for the optical pumping source of the rubidium atomic oscillator. Therefore, the rubidium atomic oscillator shown in FIG. 9 may produce a 1.56-μm optical frequency reference for the optical transmission and a microwave frequency reference.

The rubidium atomic oscillator includes an LD 37 having a 1.56-μm oscillation wavelength, a semitransparent mirror 38, and a second harmonic generator (SHG) 39.

In the rubidium atomic oscillator shown in FIG. 9, the LD 37 generates 1.56-μm light, and a part of the light is separated from the 1.56-μm light in the semitransparent mirror 38 to produce the optical frequency reference output. The residual part of the 1.56-μm light is multiplied by 2 in the SHG 39 to produce 0.78-μm light, and the multiplied 0.78-μm light is divided into two lights in the semitransparent mirror 17 and the reflecting mirror 18. These lights are supplied to the same electrical control system and optical control system as those shown in FIG. 3.

In this case, in the electrical control system, by the 0.78-μm light which passed through the semitransparent mirror 17, the microwave frequency of the oscillation output of the VCO 6 is controlled so as to be equal to the transition frequency of the rubidium atoms in the resonance cell 3. In the optical control system, for the modulated light produced from the AOM 19, the oscillation wavelength of the LD 37 is controlled so that the optical pumping wavelength in the resonance cell 3 may be equal to the wavelength which gives maximum absorption in the rubidium atoms. These operations may provide a high efficient rubidium atomic oscillator. Such effect is the same as that of the first embodiment of the rubidium atomic oscillator shown in FIG. 3.

As discussed above, the 1.56-μm light is widely used in communications using optical fibers. In the above embodiment, the rubidium atomic oscillator may simultaneously produce two reference outputs, the first is the 1.56-μm optical frequency reference output for the optical signal which is stabilized by the absorption wavelength of the rubidium atoms, and the second is, for example, the frequency reference signal output for a clock signal which is stabilized by the transition frequency of the rubidium atoms. The above-discussed configuration of the rubidium atomic oscillator using the 1.56-μm LD and the SHG may be applied to the other embodiments as well as the first embodiment.

As described above, in the rubidium atomic oscillator according to the present invention, by using only one LD, the microwave signal used for the frequency reference may efficiently be produced. As a result, a highly efficient rubidium atomic oscillator may be provided.

Further, the present invention is not limited to these embodiments, but other variations and modifications may be made without departing from the scope of the present invention.

What is claimed is:

1. A rubidium atomic oscillator comprising:
   a voltage-controlled oscillator (VCO) producing a first microwave signal for an output;
   a light source producing pumping light having a wavelength which is externally controlled;
   division means for dividing said pumping light into a first light and a second light;
   wavelength shift means for changing a wavelength of said second light to produce a third light, so that said third light has a frequency which said wavelength shift means controls by changing the wavelength of the second light;
   a cavity resonator, oscillated by a second microwave signal, which absorbs said first light and said third light, the cavity resonator having a resonance cell filled with a rubidium gas;
   an electrical control part which produces said second microwave signal based on said first microwave signal from the VCO, said electrical control part detects a level of the first light passed through said cavity resonator, and controls a frequency of said VCO so that the first light is maximally absorbed in the cavity resonator;
   an optical control part which detects a level of said third light passed through said cavity resonator and controls the wavelength of the light source so that said third light is maximally absorbed in the cavity resonator;
   wherein said wavelength shift means controls the wavelength of said third light to increase stability of said first microwave signal.

2. The rubidium atomic oscillator as claimed in claim 1, wherein:
   said light source comprises a laser diode;
   said electrical control part comprises
      a modulator modulating said first microwave signal with a first frequency to produce said second microwave signal,
      a first photo detector converting said first light passed through the cavity resonator to a first electrical signal, and
      a first coherent detector which detects the first electrical signal to produce a first detected signal and controls a frequency of said VCO by the first detected signal;
   said wavelength shift means comprises a modulator modulating said second light with a second frequency; and
   said optical control part comprises
      a second photo detector converting said third light passed through the cavity resonator to a second electrical signal, and
      a second coherent detector which detects the second electrical signal with a third frequency to produce a second detected signal and controls the wavelength of the pumping light of the laser diode by the second detected signal and the third frequency.

3. The rubidium atomic oscillator as claimed in claim 2, wherein said oscillator further comprises:
   a second-harmonic wave detector detecting a second harmonic wave of the first frequency from the first electrical signal produced in the first photo detector; and
   a peak-value detector which detects a peak value of said second harmonic wave and controls said second frequency of the wavelength shift means according to the peak value;
   wherein the wavelength of said third light produced by said wavelength shift means is automatically adjusted so as to increase stability of said first microwave signal.

4. The rubidium atomic oscillator as claimed in claim 1, wherein the resonance cell comprises a first resonance cell which passes said first light produced from the division means and a second resonance cell which passes said third light produced by the wavelength shift means.

5. The rubidium atomic oscillator as claimed in claim 1, wherein said laser source comprises:
   a laser diode generating light having wavelength which is twice that of said pumping light of the laser source, and the wavelength of the laser diode is externally controlled; and
   a second harmonic generator which generates a second harmonic signal from said light of the laser diode and produces the second harmonic signal as said pumping light of the laser source;

wherein said light of the laser diode is also produced for an optical frequency reference signal.

6. A rubidium atomic oscillator comprising:

a voltage-controlled oscillator (VCO) producing a first microwave signal for an output;

a light source producing pumping light having a wavelength which is externally controlled;

a cavity resonator, oscillated by a second microwave signal, which absorbs said pumping light, the cavity resonator having a resonance cell filled with a rubidium gas;

an electrical control part which produces said second microwave signal by modulating said first microwave signal from the VCO with a first frequency, said electrical control part detects a level of the pumping light passed through said cavity resonator, and controls a frequency of said VCO so that the pumping light is maximally absorbed in the cavity resonator; and an optical control part comprising:
  a peak-value detector which detects a peak value of a second harmonic wave of said first frequency from the pumping light passed through said cavity resonator;
  signal generation means for generating second and third frequency signals having the same frequency and different phases which are shifted from each other based on said peak value; and
  a coherent detector which detects the pumping light passed through the cavity resonator with said second frequency signal to produce a detected signal and controls the wavelength of said light source by the detected signal and said third frequency signal;

wherein the wavelength of said pumping light of the light source is automatically adjusted so as to increase stability of said first microwave signal.

7. The rubidium atomic oscillator as claimed in claim 6, wherein said signal generation means comprises a phase locked loop circuit having:

a reference oscillator which produces said third frequency signal; and a second voltage controlled oscillator which produces said second frequency signal operating in synchronization with the reference oscillator, said oscillator further including a control input provided with said peak value produced from the peak-value detector.

8. An apparatus comprising:

a voltage-controlled oscillator (VCO) which produces a first microwave signal;

a light source which produces pumping light;

a light division device which divides the pumping light into first and second lights;

a wavelength controller which controls a wavelength of the second light; a cavity resonator, oscillated by a second microwave signal, which absorbs the first light and the wavelength controlled second light, the cavity resonator having a resonance cell filled with a rubidium gas;

an electrical control part which produces the second microwave signal based on the first microwave signal, detects a level of the first light passed through the cavity resonator, and controls a frequency of the VCO so that the first light is maximally absorbed in the cavity resonator;

an optical control part which detects a level of the wavelength controlled second light passed through the cavity resonator, and controls the light source to adjust a wavelength of the pumping light so that the wavelength controlled second light is maximally absorbed in the cavity resonator, wherein the wavelength controller controls the wavelength of the second light to increase stability of the first microwave signal.

9. The apparatus as claimed in claim 8, wherein:

the light source comprises a laser diode, the wavelength controller comprises a modulator which modulates the second light with a second frequency, the electrical control part comprises
  a modulator which modulates the first microwave signal with a first frequency to produce the second microwave signal,
  a photo detector which converts the first light passed through the cavity resonator to a first electrical signal, and
  a coherent detector which detects the first electrical signal to produce a first detected signal and controls a frequency of the VCO by the first detected signal, and the optical control part comprises
  a photo detector which converts the wavelength controlled second light passed through the cavity resonator to a second electrical signal, and
  a coherent detector which detects the second electrical signal with a third frequency to produce a second detected signal and controls the wavelength of the pumping light of the laser diode by the second detected signal and the third frequency.

10. The apparatus as claimed in claim 9, further comprising:

a second-harmonic wave detector which detects a second harmonic wave of the first frequency from the first electrical signal produced by the photo detector of the electrical control part; and a peak-value detector which detects a peak value of the detected second harmonic wave and controls the second frequency of the wavelength controller according to the peak value, wherein the wavelength of the wavelength controlled second light is automatically adjusted to increase stability of the first microwave signal.

11. The apparatus as claimed in claim 8, wherein the resonance cell comprises a first resonance cell which passes the first light and a second resonance cell which passes the wavelength controlled second light.

12. The apparatus as claimed in claim 8, wherein the laser source comprises a laser diode which generates light having a wavelength which is twice that of the pumping light, and a second harmonic generator which generates a second harmonic signal from the light generated by the laser diode and produces the second harmonic signal as the pumping light of the laser source.

13. An apparatus comprising:

a voltage-controlled oscillator (VCO) which produces a first microwave signal;

a light source which produces pumping light;

a cavity resonator, oscillated by a second microwave signal, which absorbs the pumping light, the cavity resonator having a resonance cell filled with a rubidium gas;

an electrical control part which produces the second microwave signal by modulating the first microwave signal from the VCO with a first frequency, detects a level of the pumping light passed through the cavity resonator, and controls a frequency of the VCO so that the pumping light is maximally absorbed in the cavity resonator;

an optical control part comprising a peak-value detector which detects a peak value of a second harmonic wave of the first frequency from the pumping light passed through the cavity resonator, a signal generator which generates second and third frequency signals having the same frequency and different phases which are shifted from each other based on the peak value; and a coherent detector which detects the pumping light passed through the cavity resonator with the second frequency signal to produce a detected signal and controls the wavelength of the pumping light by controlling the light source with the detected signal and the third frequency signal, wherein a wavelength of the pumping light is automatically adjusted to increase stability of the first microwave signal.

14. The apparatus as claimed in claim 13, wherein the signal generator comprises a phase locked loop circuit including a reference oscillator which produces the third frequency signal, and a voltage controlled oscillator which produces the second frequency signal operating in synchronization with the reference oscillator.

* * * * *

UNITED STATES PATENT AND TRADEMARK OFFICE
CERTIFICATE OF CORRECTION

PATENT NO. : 5,751,193
DATED : May 12, 1998
INVENTOR(S) : Yoshifumi NAKAJIMA et al.

It is certified that error appears in the above-identified patent and that said Letters Patent is hereby corrected as shown below:

Col. 13, line 57, begin a new paragraph with "a cavity resnator,".

Signed and Sealed this

Eighth Day of September, 1998

Attest:

BRUCE LEHMAN

Attesting Officer     Commissioner of Patents and Trademarks